US009823292B2

United States Patent
Onishi et al.

(10) Patent No.: US 9,823,292 B2
(45) Date of Patent: *Nov. 21, 2017

(54) INFORMATION OUTPUT APPARATUS (71) Applicant: TOYOTA JIDOSHA KABUSHIKI KAISHA, Toyota-shi, Aichi-ken (JP)

(72) Inventors: Yukio Onishi, Nagoya (JP); Takato Sato, Toyota (JP); Yasushi Shinojima, Toyota (JP); Masaru Shimono, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 249 days.

This patent is subject to a terminal disclaimer.

(21) Appl. No.: 14/726,973

(22) Filed: Jun. 1, 2015

(65) Prior Publication Data
US 2016/0011133 A1 Jan. 14, 2016

(30) Foreign Application Priority Data
Jul. 14, 2014 (JP) ................. 2014-144421

(51) Int. Cl.
*G01R 31/40* (2014.01)
*G01R 31/26* (2014.01)
*G01R 31/04* (2006.01)

(52) U.S. Cl.
CPC ....... *G01R 31/2642* (2013.01); *G01R 31/048* (2013.01); *G01R 31/40* (2013.01)

(58) Field of Classification Search
CPC .. G01N 25/72; G01R 31/2642; G01R 31/048; G01R 31/40; H02M 1/32; H02M 1/38; H02M 1/53806; H03K 17/0822
See application file for complete search history.

(56) References Cited

U.S. PATENT DOCUMENTS

2004/0150377 A1* 8/2004 Elek .................. H02M 1/34
 323/207
2006/0126253 A1* 6/2006 Urakabe ............. H02M 1/38
 361/118

(Continued)

FOREIGN PATENT DOCUMENTS

JP 2002-005989 A 1/2002
JP 2009-019953 A 1/2009

(Continued)

*Primary Examiner* — Manish S Shah
(74) *Attorney, Agent, or Firm* — Oliff PLC (57) ABSTRACT An information output apparatus includes: a first switching element joined through a solder part, and forming one arm of a power conversion apparatus; a second switching element connected in series with the first switching element, and forming the other arm of the power conversion apparatus; a smoothing capacitor; a measuring unit configured to measure a temperature of the first switching element to output a measured value; an applying unit configured to apply two or more continuous pulses in a state where a potential difference across the smoothing capacitor is greater than or equal to a predetermined value, the pulses causing the first switching element and the second switching element to simultaneously turn on; an adjusting unit configured to adjust pulse widths of the pulses; and an output unit configured to output information indicating a deterioration of the solder part based on a manner of a change in measured values.

2 Claims, 6 Drawing Sheets (56) References Cited

U.S. PATENT DOCUMENTS

| | | | |
|---|---|---|---|
| 2006/0164867 A1* | 7/2006 | Dikken | H02M 1/38 363/13 |
| 2012/0075761 A1* | 3/2012 | Miura | H02M 1/32 361/93.1 |
| 2012/0119574 A1 | 5/2012 | Sone et al. | |
| 2012/0229061 A1 | 9/2012 | Itoh et al. | |
| 2013/0026841 A1* | 1/2013 | Hosini | H02J 3/1842 307/77 |
| 2014/0218833 A1* | 8/2014 | Wu | H03K 17/0828 361/93.1 |

FOREIGN PATENT DOCUMENTS

| | | |
|---|---|---|
| JP | 2009-261227 A | 11/2009 |
| JP | 2010-136472 A | 6/2010 |
| JP | 2010-246246 A | 10/2010 |
| JP | 2012-110071 A | 6/2012 |
| JP | 2012-210138 A | 10/2012 |
| JP | 2012-235081 A | 11/2012 |
| JP | 2013-146130 A | 7/2013 |
| JP | 2013-242110 A | 12/2013 |
| JP | 2014-147206 A | 8/2014 |

* cited by examiner

INFORMATION OUTPUT APPARATUS

BACKGROUND OF THE INVENTION

1. Field of the Invention

The disclosure is related to an information output apparatus.

2. Description of the Related Art

A technology is known, in which a service-life measuring pulse with its pulse width of around 10 μs is applied only once to upper and lower IGBT (Insulated Gate Bipolar Transistor) switching element to detect deterioration in a solder joint (for example, Japanese Laid-open Patent Publication No. 2009-19953).

However, actually, the deterioration in the solder joint cannot be detected in high precision since the IGBT is not heated enough by the short-circuiting current generated by applying only once the service-life measuring pulse with its pulse width of around 10 μs.

RELATED ART DOCUMENT

Patent Document

[Patent Document 1]: Japanese Laid-open Patent Publication No. 2009-19953

SUMMARY OF THE INVENTION

An object of the present disclosure is to provide an information output apparatus capable of outputting information precisely indicating a deterioration state of solder for jointing a switching element.

The following configuration is adopted to achieve the aforementioned object.

In one aspect of the embodiment, there is provided an information output apparatus comprising: a first switching element joined through a solder part to a surface of a substrate cooled by a refrigerant, and forming one arm of a power conversion apparatus; a second switching element connected in series with the first switching element, and forming the other arm of the power conversion apparatus; a smoothing capacitor disposed in parallel with the first switching element and the second switching element; a measuring unit configured to measure a temperature of the first switching element to output a measured value corresponding to the measured temperature; an applying unit, achieved by a process performed by a processing device, configured to apply two or more continuous pulses to the first switching element and the second switching element in a state where a potential difference across the smoothing capacitor is greater than or equal to a predetermined value, the pulses causing the first switching element and the second switching element to simultaneously turn on; an adjusting unit, achieved by a process performed by the processing device, configured to adjust pulse widths of the pulses so that a difference between a temperature of the first switching element before having the pulses applied and a temperature of the first switching element after having the pulses applied becomes greater than or equal to a predetermined temperature; and an output unit, achieved by a process performed by the processing device, configured to output information indicating a deterioration of the solder part based on a manner of a change in measured values, the measured values being output from the measuring unit when the pulses are applied.

Other objects, features and advantages of the present invention will become more apparent from the following detailed description when read in conjunction with the accompanying drawings.

DETAILED DESCRIPTION OF THE PREFERRED EMBODIMENTS

In the following, embodiments are described in detail with reference to appended drawings.

Figure 1:
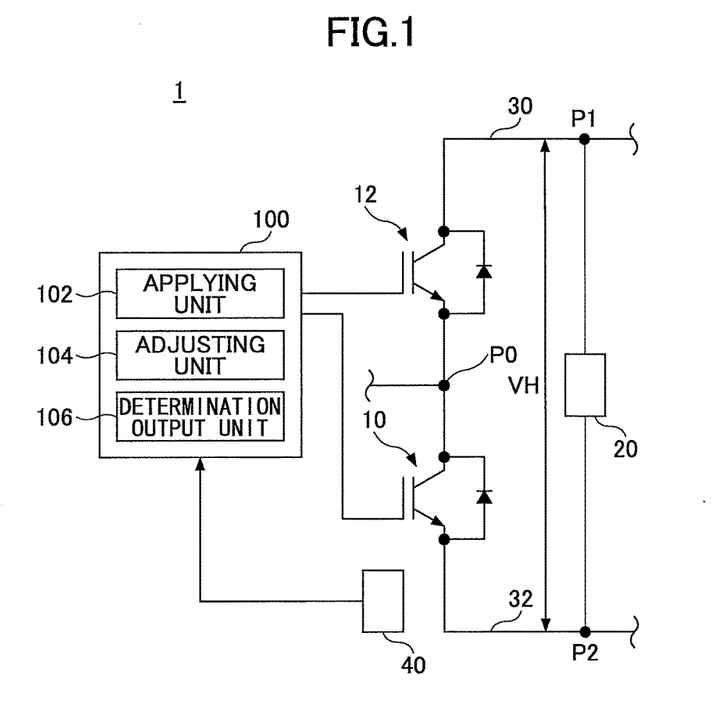
FIG. 1 is a diagram for illustrating configuration of an information output apparatus 1.
Figure 2:
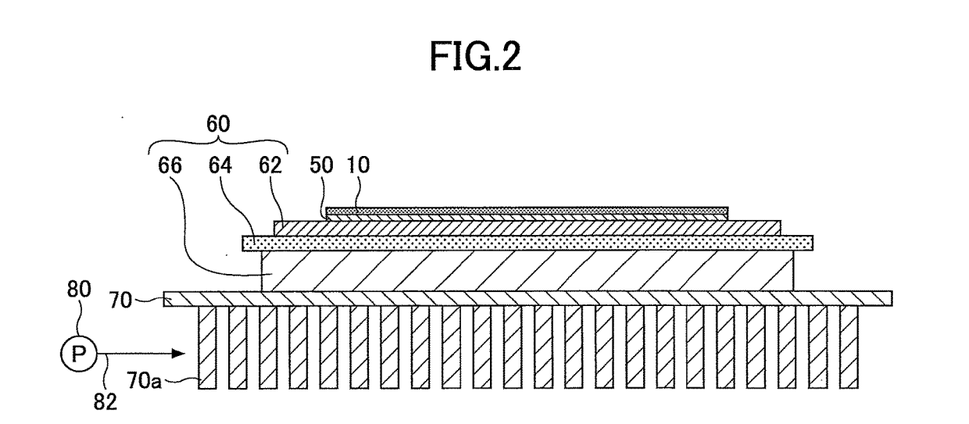
FIG. 2 is a diagram for illustrating an example of a mounted first switching element 10.

FIG. 1 is a diagram for illustrating a configuration of an information output apparatus 1. FIG. 2 is a diagram for illustrating an example of a mounted first switching element 10.

The information output apparatus 1 includes the first switching element 10, a second switching element 12, a smoothing capacitor 20, a temperature sensor 40, and a processing device 100.

In this example, the first switching element 10 is an IGBT (Insulated Gate Bipolar Transistor). The first switching element 10 may be formed by another switching element such as a MOSFET (Metal Oxide Semiconductor Field-Effect Transistor) instead of the IGBT. As shown in FIG. 1, a FWD (Free Wheeling Diode) may be disposed with the first switching element 10. An emitter electrode of the first switching element 10 is connected with a negative electrode line 32 while a collector electrode of the first switching element 10 is connected to a positive electrode line 30 through the second switching element 12.

As shown in FIG. 2, the first switching element 10 is mounted on a substrate 60 through a solder part 50. The substrate 60 is mounted on the heat sink 70. A lower surface (opposite to the substrate 60) of the heat sink 70 is in contact with a refrigerant. Fins 70a may be formed in the lower surface of the heat sink 70. Additionally, although a configuration of the substrate 60 is optional, the substrate 60 is formed by disposing aluminum plates 62 and 66 at both sides of a ceramic substrate 64 such as aluminum nitride, in FIG. 2. Also, the substrate 60 may be formed by disposing copper plates at both sides of the ceramic substrate or may be formed only of a copper plate (heat spreader). In a case where the substrate 60 is formed only of a copper plate, the substrate 60 is mounted on the heat sink 70 through an insulation layer such as an insulation film.

In this example, although the second switching element 12 is an IGBT, the second switching element may be formed of another switching element. As shown in FIG. 1, a FWD may be disposed with the second switching element. As shown in FIG. 1, the first switching element 10 and the second switching element. 12 are connected in series between the positive electrode line 30 and the negative electrode line 32. An emitter electrode of the second switching element 12 is connected with the collector electrode of the first switching element 10 while a collector electrode of the second switching element 12 is connected with the positive electrode line 30.

Similarly to the first switching element 10, the second switching element 12 is mounted on a substrate. Additionally, the substrate on which the second switching element 12 is mounted is electrically insulated from the substrate 60 on which the first switching element 10 is mounted.

The smoothing capacitor 20 is disposed between the positive electrode line 30 and the negative electrode line 32 in parallel with the first switching element 10 and the second switching element 12. For example, a capacitance of the smoothing capacitor 20 is 1 mF.

The temperature sensor 40 measures a temperature of the first switching element 10. The temperature sensor 40 may be formed in a chip including the first switching element 10.

The processing device 100 includes an applying unit 102, an adjusting unit 104 and a determination output unit 106. The processing device 100 includes a microcomputer having a CPU. Functions of the processing device 100 (for example, respective functions of the applying unit 102, the adjusting unit 104 and the determination output unit 106, described below) may be achieved by arbitrary hardware, software, firmware or a combination thereof. For example, the functions of the processing device 100 may be achieved by an ASIC (application-specific integrated circuit) or an FPGA (Field Programmable Gate Array) for a specific use. Also, the processing device 100 may be achieved by a plurality of processing devices (including a processing device formed in a sensor).

The applying unit 102 applies two or more continuous test drive pulses for simultaneously switching on the first switching element 10 and the second switching element 12 to the first switching element 10 and the second switching element 12, wherein a potential difference VH between both sides of the smoothing capacitor 20 is greater than or equal to a predetermined value VHth. The predetermined value VHth may be determined so that a temperature variance ΔT (described below) of the first switching element 10 in response to having the test drive pulse applied becomes greater than or equal to a predetermined temperature Tth.

The adjusting unit 104 adjusts a pulse width of the test drive pulse so that a temperature variance (difference) ΔT between before and after applying the test drive pulse to the first switching element 10 becomes greater than or equal to a predetermined temperature Tth. A specific example of method for adjusting by the adjusting unit 104 will be described below.

The determination output unit 106 outputs information indicating a deterioration of the solder part 50 based on the change of sensing values from the temperature sensor 40 when the two or more test drive pulses whose pulse widths are adjusted by the adjusting unit 104 are applied. The information indicating the deterioration of the solder part 50 indicates the deterioration of the solder part 50 directly or indirectly. For example, the determining unit 106 may output sensing values (change of the sensing values) sequentially (chronologically) output from the temperature sensor 40 when the two or more test drive pulses whose pulse widths are adjusted by the adjusting unit 104 are applied, thereby outputting the information indirectly indicating the deterioration of the solder part 50. In this case, for example, an inspector in a dealer shop may determine the deterioration of the solder part 50 with reference to the sensing values sequentially output from the temperature sensor 40. Also, the determination output unit 106 may determine the deterioration of the solder part 50 based on the change of the sensing values output from the temperature sensor 40 when the two or more test drive pulses whose pulse widths are adjusted by the adjusting unit 104 are applied, and output the determination result (an example of the information directly indicating the deterioration of the solder part 50). A specific example of a method for determining by the determination output unit 106 will be described below. Additionally, an output destination is optional, and it may be, for example, an onboard display, a terminal device in a dealer shop, an external server or the like.

Additionally, in FIG. 2, a pump 80 for providing the refrigerant to a flow passage of the refrigerant, which is formed in the lower surface side of the heat sink 70, is schematically shown. The pump 80 forms a flow (circulation) of the refrigerant, which flows in a flow passage 82 thereby passing between the fins 70a of the heat sink 70. The refrigerant is optional and may be air, or liquid such as LLC (Long-Life Coolant). In this example, the refrigerant is water and the pump 80 is a water pump.

Figure 3:
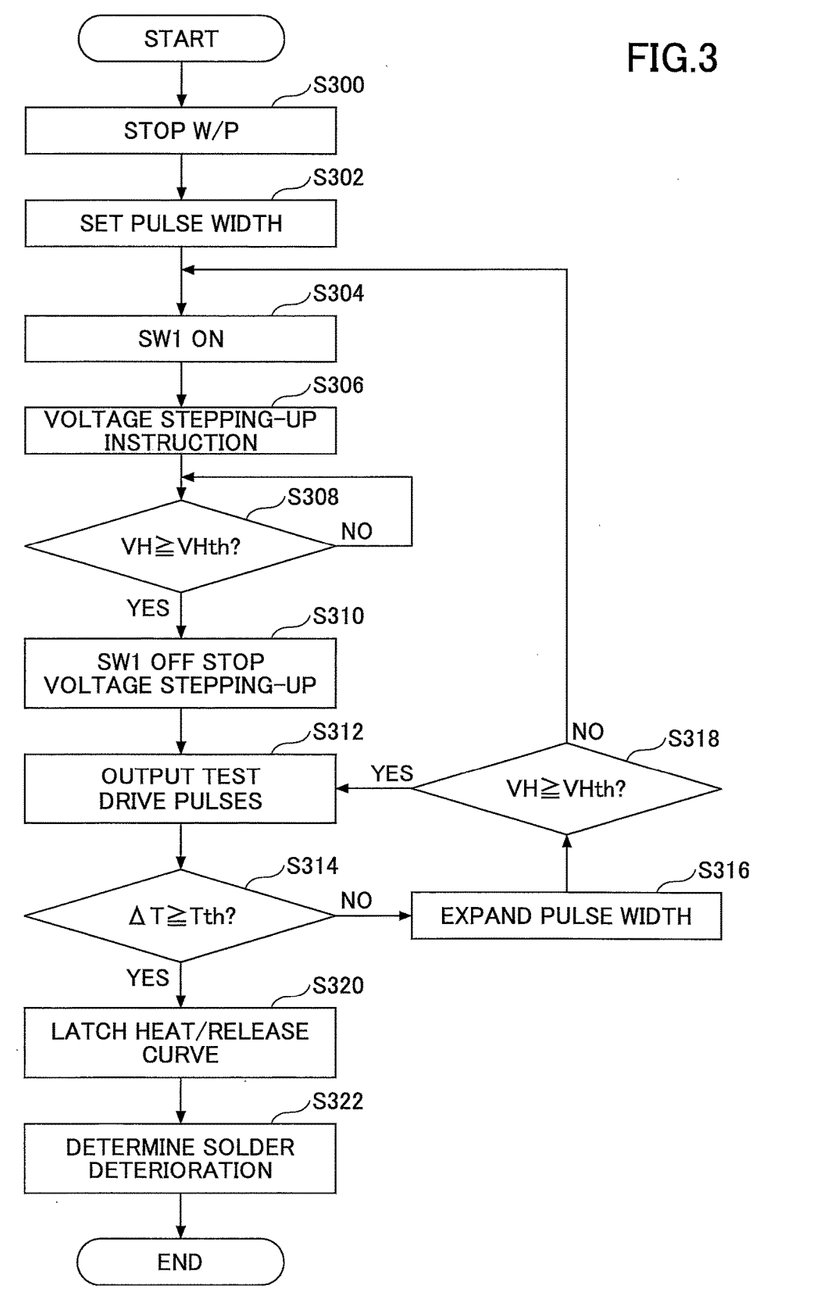
FIG. 3 is a flowchart for illustrating an example of a solder deterioration determination process performed by the processing device 100.
Figure 4:
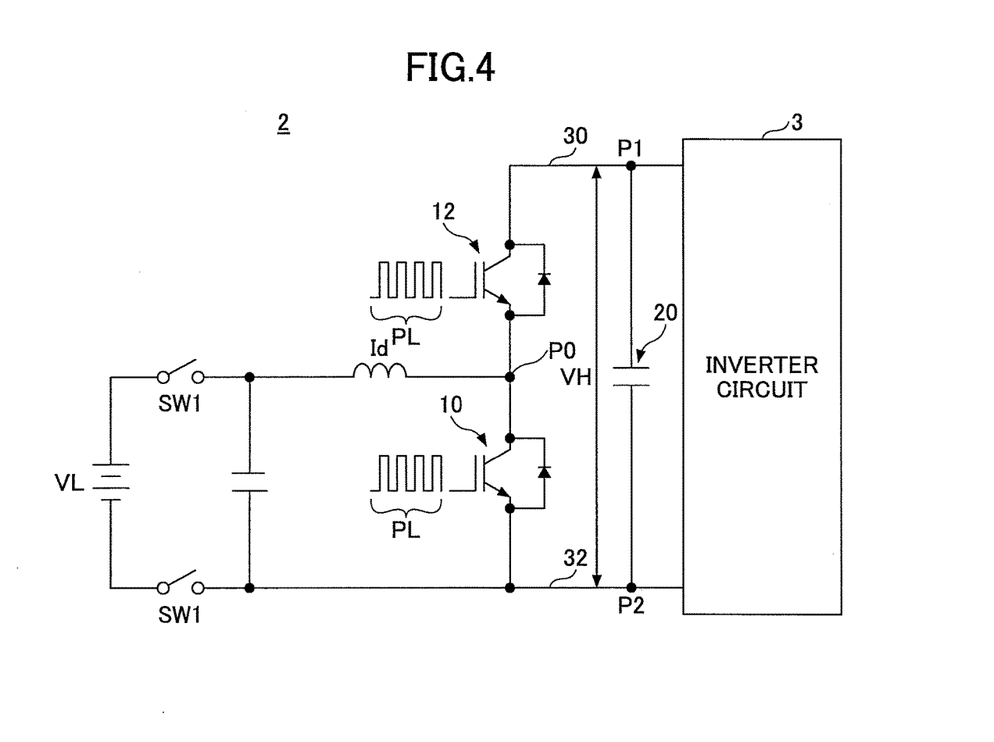
FIG. 4 is a diagram illustrating an example of a circuit including the first switching element 10.

FIG. 3 is a flowchart for illustrating an example of a solder deterioration determination process performed by the processing device 100. Here, the description is given assuming that the first switching element 10, the second switching element 12 and the smoothing capacitor 20 shown in FIG. 1 are included in the electric circuit 2 shown in FIG. 4. The electric circuit 2 shown in FIG. 4 is a circuit for a driving motor used in a hybrid vehicle or an electric vehicle and includes a DC power supply VL. The first switching element 10 and the second switching element 12 form a converter in cooperation with an inductor Id connected at a central point P0 between the first switching element 10 and the second switching element 12, thereby performing a voltage stepping-up operation and a voltage stepping-down operation. The driving motor (not shown) is connected to an inverter circuit 3.

For example, the process shown in FIG. 3 may be started when turning on an ignition switch or when turning off the ignition switch, and also may be started when receiving a certain test signal from a mobile device or the like in the dealer shop. Here, the description is given assuming that the process shown in FIG. 3 is started when turning on the ignition switch.

In step S300, the processing device 100 stops the pump 80 (W/P). Additionally, in a case where the pump 80 has been stopped, it is kept being stopped. In a case where the pump 80 is not included, the process of step S300 may be omitted.

In step S302, the adjusting unit 104 of the processing device 100 sets the pulse width of the test drive pulse to be an initial value. The initial value may correspond to a minimum value among the settable pulse widths. For example, the initial value may be 5 μs.

In step S304, the processing device 100 switches on the switch SW1 (see FIG. 4). Thus, the DC power supply VL (see FIG. 4) is connected to the inverter circuit 3 (see FIG. 4) through the converter.

In step S306, the processing device 100 generates a voltage stepping-up instruction to perform the voltage stepping up operation. For example, the voltage stepping-up instruction may indicate an output voltage of the converter (potential difference VH between P1 and P2) of 500 V. Also, for example, only the first switching element 10 in a lower arm may be switched on/off according to the voltage stepping-up instruction. Thus, the voltage supplied from the DC power supply VL is stepped-up and output to the inverter circuit 3, while charge for generating potential difference VH (greater than "0") is accumulated in the smoothing capacitor 20.

In step S308, the processing device 100 determines whether the potential difference VH is greater than or equal to the predetermined value VHth. The predetermined value VHth may be slightly lower than a target value (for example, 500 V) of the output value of the converter. In a case where the potential difference VH is greater than or equal to the predetermined value VHth (YES in S308), the process proceeds to step S310. In a case where the potential difference VH is not greater than or equal to the predetermined value VHth, the process waits until the potential difference VH becomes greater than or equal to the predetermined value VHth (while the voltage stepping-up operation is continued).

In step S310, the processing device 100 switches off the switch SW1 and stops performing the voltage stepping-up operation. Thus, the first switching element 10 (and the second switching element 12) is switched off.

In step S312, the applying unit 102 of the processing device 100 continuously outputs the test drive pulses (see "PL" in FIG. 4) and applies them to the first switching element 10 and the second switching element 12. A frequency of the output test drive pulses is defined by a frequency of a carrier signal for generating the pulses. For example, the frequency of the carrier signal may be 50 kHz. The applying unit 102 applies the test drive pulses so that the first switching element 10 and the second switching element 12 are switched on at the same time. The applying unit 102 continuously outputs the test drive pulses within a certain period T1. For example, the certain period T1 is a period from 3 ms to 110 ms, preferably, is a period from 5 ms to 100 ms, and more preferably, is a period from 5 ms to 20 ms. Also, the certain period T1 may be a time it takes the potential difference VH to be a predetermined value (for example 0 V). In this case, the applying unit 102 continuously outputs the test drive pulses until the potential difference VH becomes a certain value. When passing the certain period T1, the process proceeds to step S314.

In step S314, the adjusting unit 104 of the processing device 100 determines, based on the sensing values of the temperature sensor 40, whether a temperature of the first switching element 10 increases greater than or equal to the predetermined temperature Tth, that is, determines whether the temperature variance ΔT of the first switching element 10 is greater than or equal to the predetermined temperature Tth. The temperature variance ΔT may be a difference between a temperature of the first switching element 10 just before having the test drive pulses applied and that after having applied the test drive pulses applied. Or it may be a difference between a temperature of the first switching element 10 just before the test drive pulses are applied and a peak (highest) temperature of the first switching element 10 while the test drive pulses are being applied. A measured temperature of the refrigerant may be used, instead of the sensing value of the temperature sensor 40, as the temperature of the first switching element 10 just before the test drive pulses are applied, since the temperature of the refrigerant just before the test drive pulses are applied is assumed to be almost the same as the temperature of the first switching element 10 just before the test drive pulses are applied. In a case where the temperature variance ΔT of the first switching element 10 is greater than or equal to the predetermined temperature Tth, the process proceeds to step S320. In a case where the temperature variance ΔT of the first switching element 10 is not greater than or equal to the predetermined temperature Tth, the process proceeds to step S316.

In step S316, the adjusting unit 104 of the processing device 100 expands the pulse width of the test drive pulse. For example, the adjusting unit 104 expands the pulse width of the test drive pulse by 12.5 ns. Therefore, when the process of step S312 is performed next time, the applying unit 102 of the processing device 100 outputs the test drive pulses whose pulse widths are expanded in step S316. Additionally, the adjusting unit 104 expands the pulse width of the test drive pulse as long as the pulse width does not exceed a certain upper limit. The certain upper limit depends on short-circuiting tolerance of the first switching element 10, and may be, for example, several dozen μs.

In step S318, the processing device 100 determines whether the potential difference VH is greater than or equal to the predetermined value VHth. In a case where the potential difference VH is greater than or equal to the predetermined value VHth, the process proceeds to step S312. In a case where the potential difference VH is not greater than or equal to the predetermined value VHth, the process returns to step S304.

Figure 5:
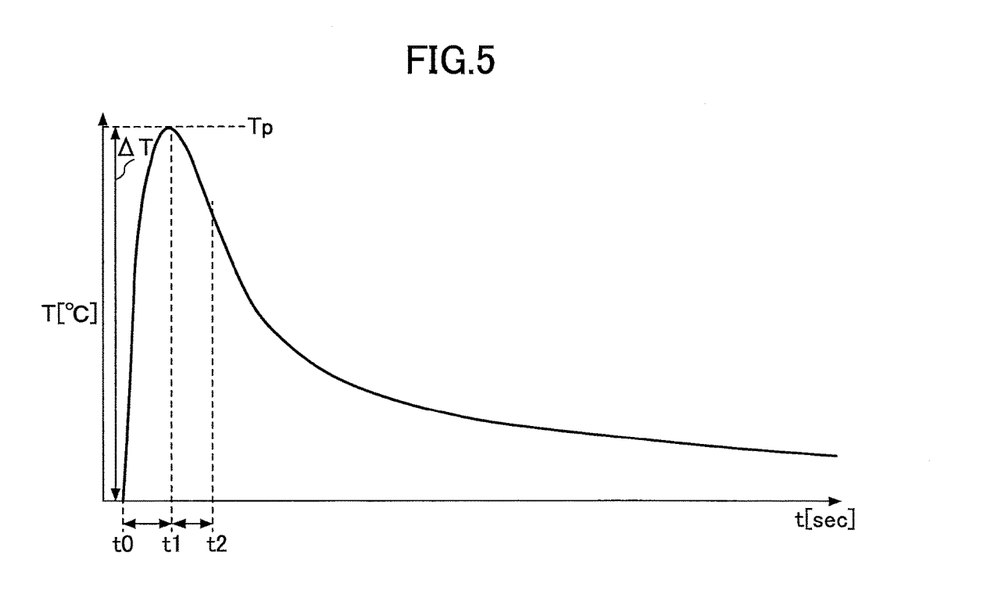
FIG. 5 is a diagram for showing an example of the heat/release curve.

In step S320, the determination output unit 106 of the processing device 100 acquires (latches) a heat/release curve while applying the test drive pulses. FIG. 5 is a diagram for showing an example of the heat/release curve. In FIG. 5, the heat/release curve is shown where the horizontal axis shows time and the vertical axis shows the temperature (sensing value of the temperature sensor 40) of the first switching element 10. In FIG. 5, the temperature of the first switching element 10 rapidly increases from timing T0 at which the test drive pulse is started to be applied and reaches its peak at timing t1 from which the temperature gradually decreases. The reason the temperature rapidly increases from timing T0 is that a great short-circuiting current flows at timing T0 since the potential difference VH is great, and transfer of heat generated by the first switching element 10 to the substrate 60 is temporarily shut off by the solder part 50. The reason the temperature gradually decreases from timing t1 is that the potential difference VH gradually becomes smaller.

In step S322, the determination output unit 106 of the processing device 100 determines, based on the heat/release curve, the deterioration of the solder part 50 and outputs the determination result. The method for determining based on the heat/release curve is optional.

Figure 6:
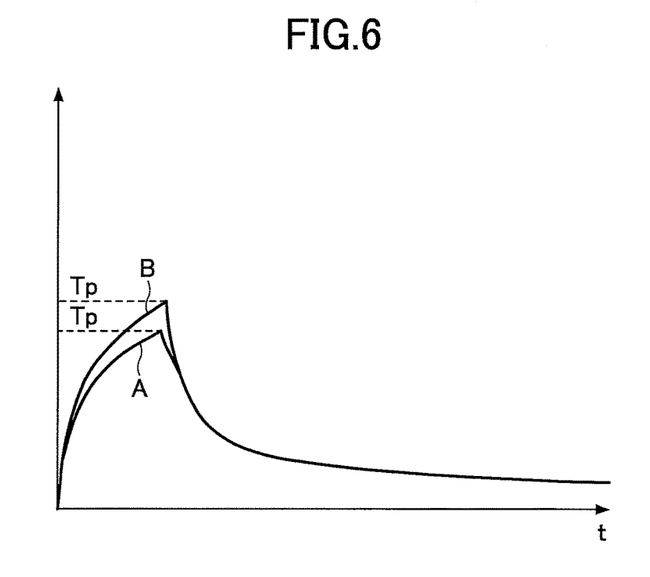
FIG. 6 is a diagram for showing an example of the heat/release curve according to a deterioration of a solder part with relatively small loss.
Figure 7:
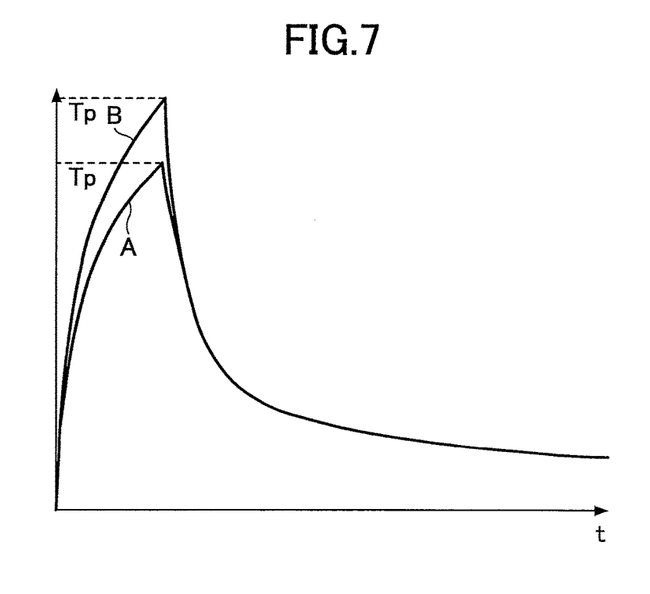
FIG. 7 is a diagram for showing another example of the heat/release curve according to a deterioration of a solder part with relatively large loss.

The heat/release curve varies according to the deterioration of the solder part 50. FIG. 6 is a diagram for showing another example of the heat/release curve in a case where the test drive pulses are continuously applied within 10 ms (a certain period T1) to cause loss corresponding to 800 W in the first switching element 10. In FIG. 6, a curved line A shows a case of a non-deteriorated (non-defective) solder part 50, while a curved line B shows a case of a deteriorated solder part 50. As shown in FIG. 6, in a case where the solder part 50 is deteriorated, the peak temperature TP in the curve becomes higher in comparison to a case where the solder part 50 is not deteriorated. This is caused by the deterioration of the solder part 50 which causes shutting off the transfer of heat to the substrate 60. Therefore, the determination output unit 106 of the processing device 100 may determine the deterioration of the solder part 50 based on the peak temperature TP in the heat/release curve. FIG. 7 is a diagram for showing another example of the heat/release curve in a case where the test drive pulses are continuously applied within 10 ms to cause loss corresponding to 1600 W in the first switching element 10. In FIG. 7, a curved line A shows a case of non-deteriorated (non-defective) solder part 50, while a curved line B shows a case of deteriorated solder part 50. Similarly to FIG. 6, as shown in FIG. 7, in a case where the solder part 50 is deteriorated, the peak temperature TP in the curve becomes higher in comparison to a case where the solder part 50 is not deteriorated. Also, as shown in FIG. 6 and FIG. 7, the difference between the respective peak temperatures Tp becomes greater when the loss becomes greater. For example, in FIG. 7, the difference between the respective peak temperatures TP is more than two times greater than that in FIG. 6. This shows that the deterioration of the solder part 50 can be more precisely determined when the loss generated in the first switching element 10 becomes greater. Additionally, the predetermined temperature Tth (threshold with respect to temperature variance ΔT) referred to in step S314 may be set taking this into account. That is, since the temperature variance ΔT depends on the loss in the first switching element 10, the deterioration of the solder part 50 can be precisely determined by setting the predetermined temperature Tth to be a large value. Although depending on precision of the temperature sensor 40, a required determination precision or the like, in a case where the deterioration is determined when the difference between the respective peak temperatures Tp becomes greater than or equal to 10% of the peak temperature Tp of non-defective product, for example, the predetermined temperature Tth may be set so that the 10% of the peak temperature Tp is greater than or equal to 5° C.

The determination result of the deterioration of the solder part 50 may be output in an arbitrary manner. For example, two types of determination result merely indicating presence or absence of the deterioration may be output, or three or more types of determination result may be output. The two types of determination result may be expressed by outputting an alarm only when the presence of deterioration is determined. Also, the determination output unit 106 of the processing device 100 may output the difference between the respective peak temperatures Tp (difference of the peak temperatures between the tested product and the non-defective product), or the heat/release curve itself, as the determination result of the deterioration of the solder part 50. In this case, for example, an inspector in a dealer shop may determine the deterioration of the solder part 50 with reference to the difference value or the heat/release curve.

In this example, the determination output unit 106 of the processing device 100 detects the peak temperature Tp based on the heat/release curve, thereby determining the presence of the deterioration in a case where the detected peak temperature Tp is higher than a reference temperature by a value greater than or equal to a predetermined threshold while determining the absence of the deterioration in a case where the detected peak temperature Tp is not higher than the reference temperature by a value greater than or equal to the predetermined threshold. The reference temperature may be set based on data acquired through an experiment. For example, the data acquired through an experiment may indicate the peak temperature Tp of a non-defective product having the test drive pulses applied in the same condition (the pulse width or the certain period T1). Or, the reference temperature may be set to be another peak temperature Tp which is detected based on a heat/release curve of the second switching element 12. The second switching element 12 is disposed in the upper arm and a frequency of driving the second switching element 12 is significantly lower than that of the first switching element 10. Therefore the heat/release curve of the second switching element 12 is used since the second switching element 12 is likely to remain non-defective.

According to the process shown in FIG. 3, the deterioration of the solder part 50 can be determined based on the variance of temperature of the first switching element 10 when applying the test drive pulses to it, which is indicated by the heat/release curve. Also, the deterioration of the solder part 50 is determined based on the heat/release curve in which the temperature variance ΔT of the first switching element 10 is greater than or equal to the predetermined temperature Tth. Therefore, the precision of the determination result can be improved.

Figure 8A:
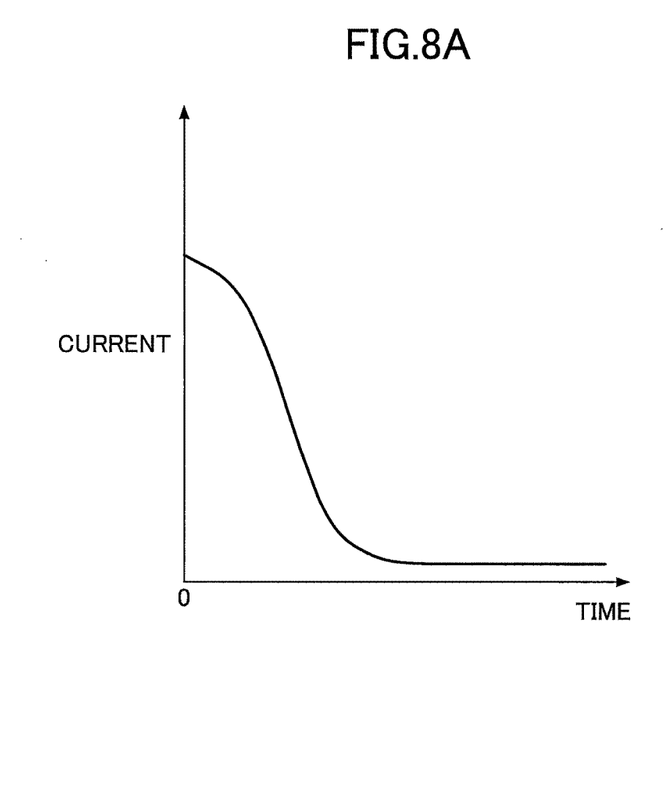
FIG. 8A is a diagram for illustrating change of short-circuiting current in a case where the pulse width of the test drive pulse is 5 μs.
Figure 8B:
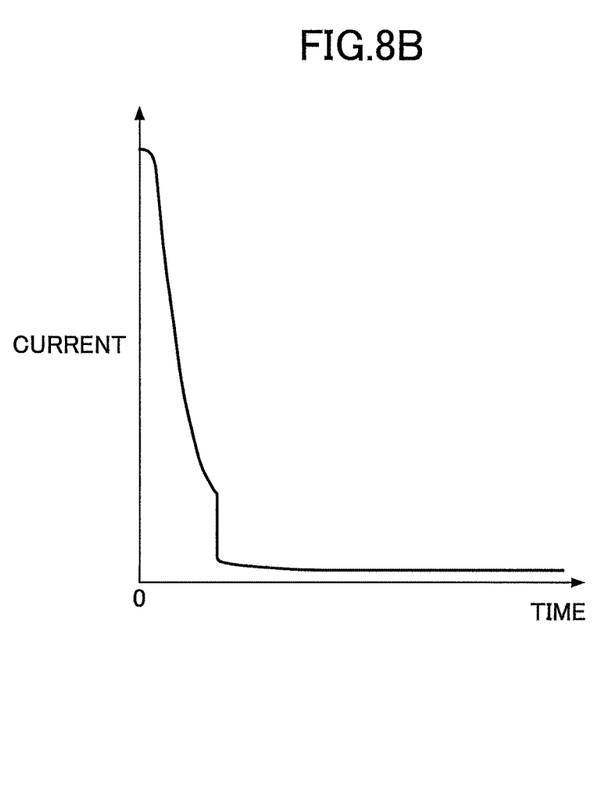
FIG. 8B is a diagram for illustrating change of short-circuiting current in a case where the pulse width of the test drive pulse is 5.1 μs.

FIG. 8A and FIG. 8B are diagrams for illustrating change of short-circuiting current when applying the test drive pulses. FIG. 8A is a diagram for illustrating change of short-circuiting current in a case where the pulse width of the test drive pulse is 5 μs. FIG. 8B is a diagram for illustrating change of short-circuiting current in a case where the pulse width of the test drive pulse is 5.1 μs.

As shown in FIG. 8A and FIG. 8B, in a case where the pulse width of the test drive pulse is 5 μs, a period in which the short-circuiting current flows becomes longer although a peak value of the short-circuiting current becomes lower in comparison to the case where the pulse width of the test drive pulse is 5.1 μs. As a consequence, the temperature variance ΔT of the first switching element 10 becomes 50° C. in a case where the pulse width of the test drive pulse is 5 μs while it becomes 19° C. in a case where the pulse width of the test drive pulse is 5.1 μs. In a case where the pulse width of the test drive pulse is 5 μs, the loss in the first switching element 10 becomes greater, which causes the determination result to be in higher precision, in comparison to the case where the pulse width of the test drive pulse is 5.1 μs. This means that since energy is consumed in the smoothing capacitor 20 in response to an instantaneously large current flow when the test drive pulses with longer pulse widths are applied, the loss in the first switching element 10 becomes smaller. Meanwhile, if the pulse width of the test drive pulse is too short, the required loss cannot be generated since the short-circuiting current is small or does not substantially flow. Thus, there is an appropriate value of the pulse width for maximizing the loss. However, the appropriate value of the pulse width varies according to individual difference (the individual difference of the first switching element 10 or that of the driving circuit).

According to the process shown in FIG. 3, certain precision of the determination result can be kept since the pulse width for generating more than a certain loss (the temperature difference ΔT greater than or equal to the predetermined temperature Tth) is searched for while slightly varying the pulse width (see step S314 and S316).

Additionally, in the process shown in FIG. 3, the pulse width for causing the maximum temperature difference ΔT is not searched for. However, the pulse width for causing the maximum temperature difference ΔT may be searched for and the deterioration of the solder part 50 may be determined based on the heat/release curve with the pulse width for causing the maximum temperature difference ΔT.

Figure 9:
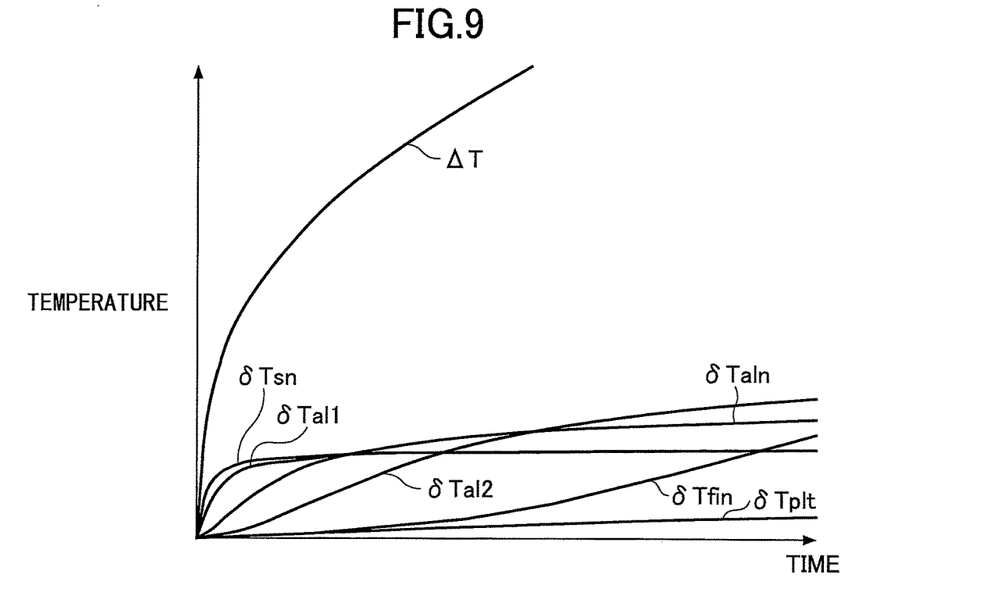
FIG. 9 is a diagram for illustrating an example of variance of temperature of the solder part 50 and the like when applying the test drive pulse.
Figure 10:
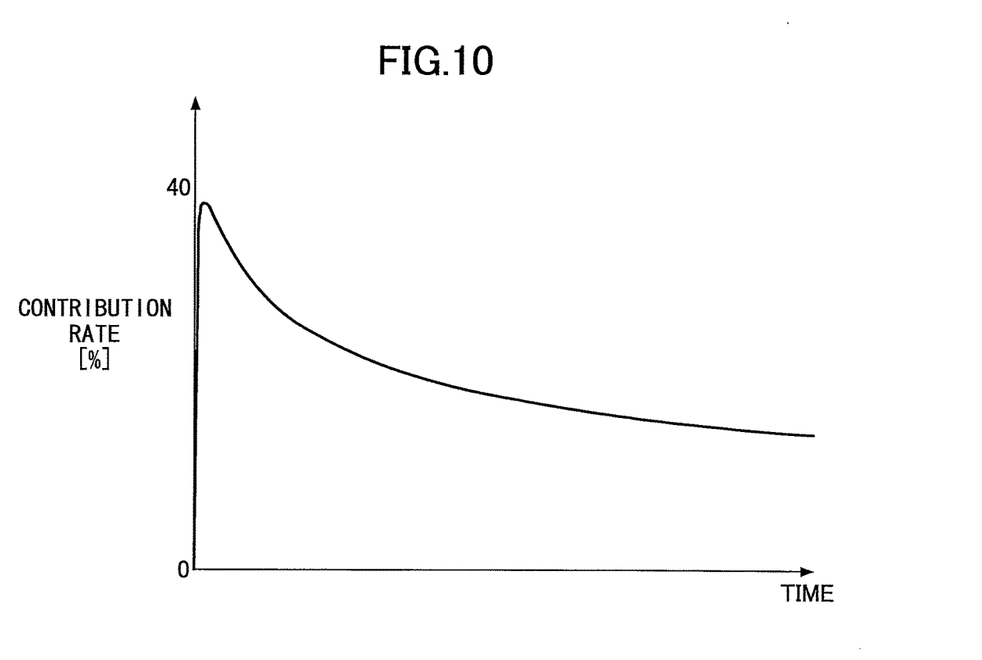
FIG. 10 is a diagram for illustrating contribution rate of the solder part 50 in the variance of temperature of the first switching element 10.

FIG. 9 is a diagram for illustrating an example of variance of temperature of the solder part 50 and the like when the test drive pulses are applied. FIG. 10 is a diagram for illustrating a contribution rate of the solder part 50 in the variance of temperature of the first switching element 10 shown in FIG. 9.

In FIG. 9, a curved line shown as "ΔT" indicates the temperature variance of the first switching element 10, a curved line shown as "δTsn" indicates the temperature variance of the solder part 50, a curved line shown as "δTal1" indicates the temperature variance of the aluminum plate 62 (see FIG. 2), a curved line shown as "δTal2" indicates the temperature variance of the aluminum plate 66 (see FIG. 2), a curved line shown as "δTaln" indicates the temperature variance of the ceramic substrate 64 (see FIG. 2), a curved line shown as "δTplt" indicates the temperature variance of the heat sink 70 (see FIG. 2), and a curved line shown as "δTfin" indicates the temperature variance of the fins 70a (see FIG. 2).

As shown in FIG. 9, the temperature of the solder part 50 is saturated relatively quickly. In FIG. 9, the temperature of the solder part 50 is saturated in around 10 ms. When the temperature of the solder part 50 is saturated, the heat generated by the first switching element 10 is likely to be transferred to the substrate 60 disposed in the lower layer with respect to the solder part 50. Thus, as shown in FIG. 10, the contribution rate of the solder part 50 to the temperature of the first switching element 10 decreases relatively quickly. The contribution rate of the solder part 50 to the temperature of the first switching element 10 expresses that how much the solder part 50 shuts off the transfer of the heat from the first switching element 10 to the substrate 60. Therefore, the deterioration of the solder part 50 can be precisely determined in a case where the temperature variance of the first switching element 10 with the high contribution rate is used. In FIG. 10, the contribution rate of the solder part 50 reaches at its peak (approx. 40%) in several ms, then it significantly decreases to reach approx. 4% in 1 s.

Additionally, according to the process shown in FIG. 3, as described above, the determination output unit 106 of the processing device 100 determines the deterioration of the solder part 50 based on the peak temperature Tp. If a timing at which the peak temperature Tp is generated is coincident with a timing at which the contribution rate of the solder part 50 reaches its peak, the deterioration of the solder part 50 can be precisely determined. Therefore, the adjusting unit 104 of the processing device 100 may adjust the pulse width so that the peak temperature Tp is generated in a short period (for example, within 10 ms). Thus, the deterioration of the solder part 50 can be precisely determined.

Additionally, in the process shown in FIG. 3, although the determination output unit 106 of the processing device 100 determines the deterioration of the solder part 50 based on the peak temperature Tp, the deterioration of the solder part 50 may be determined based on other parameters instead of or in addition to the peak temperature Tp. For example, the other parameters may include a temperature variance ΔT up to the peak temperature Tp, a speed of temperature rise to the peak temperature Tp, a time taken to reach a predetermined temperature (for example, 100° C.), a speed (change rate against time) of temperature drop from the peak temperature Tp, and the like. The speed of temperature rise to the peak temperature Tp may be defined based on a time taken to raise the temperature to the peak temperature Tp (time t0-t1 in FIG. 5), or it may be defined based on the temperature of the first switching element 10 after passing a certain time (for example, 5 μs) from applying the test drive pulse. The speed of temperature drop from the peak temperature Tp may be defined, for example, as shown in FIG. 5, based on a temperature of the first switching element 10 when a certain time (for example, 5-20 μs) passes from timing t1 at which the temperature reaches its peak temperature Tp, or based on a time (time t1-t2 in FIG. 5) taken to drop the temperature to a predetermined temperature from timing t1 at which the temperature reaches its peak temperature Tp. These parameters may be used as an arbitrary combination thereof. In this case, the determination output unit 106 of the processing device 100 may determine the deterioration of the solder part 50 taking into account of the following. The temperature variance ΔT up to the peak temperature Tp is likely to increase as the degree of the deterioration of the solder part 50 increases. The speed of temperature rise to the peak temperature Tp is likely to increase as the degree of the deterioration of the solder part 50 increases. The time taken to reach a predetermined temperature is likely to decrease as the degree of the deterioration of the solder part 50 increases. The speed of temperature drop from the peak temperature Tp is likely to decrease as the degree of the deterioration of the solder part 50 increases. The transfer of the heat from the first switching element 10 to the substrate 60 is more shut off as the degree of the deterioration of the solder part 50 increases, which causes the aforementioned tendencies.

Also, the determination output unit 106 of the processing device 100 may determine the deterioration of the solder part 50 by comparing a waveform (pattern) of the heat/release curve of the first switching element 10 with a reference pattern. The reference pattern may be set based on data acquired through an experiment (for example, a heat/release curve of a non-defective product when the test drive pulses are applied in the same condition). Or, the reference pattern may be set based on a heat/release curve of the second switching element 12. The second switching element 12 is disposed in the upper arm and a frequency of driving the second switching element 12 is significantly lower than that of the first switching element 10. Therefore the heat/release curve of the second switching element 12 is used since the second switching element 12 is likely to remain non-defective. In this case, the determination output unit 106 of the processing device 100 may compare the pattern of the heat/release curve in a term where the contribution rate of the solder part 50 is relatively high (for example, a term of 0-20 μs).

Herein above, although the invention has been described with respect to a specific embodiment, the appended claims are not to be thus limited. It should be understood that the various changes, substitutions, and alterations could be made hereto without departing from the spirit and scope of the claims. Further, all or part of the components of the embodiments described above can be combined.

For example, although in the embodiment described above, mainly, the first switching element 10 and the second switching element 12 shown in FIG. 1 respectively form the lower arm and the upper arm of the converter (an example of a power conversion apparatus), the present technology can be applied to a case where the first switching element 10 and the second switching element 12 shown in FIG. 1 respectively form a lower arm and a upper arm (or a upper arm and a lower arm) of the inverter circuit 3 (another example of the power conversion apparatus.)

Further, although in the embodiment described above, in step S312 shown in FIG. 3, the pulse widths of the output pulses are fixed, the pulse widths may be variable.

Also, in the embodiment described above, as shown in FIG. 3, the adjusting unit 104 sets the initial value of the pulse width to be a minimum value among the settable pulse widths (see step S302), and gradually expands the pulse width until the temperature variance $\Delta T$ of the first switching element 10 caused by applying pulses becomes greater than or equal to the predetermined temperature Tth (step S316). However, the adjusting unit 104 may set the initial value of the pulse width to be a maximum value among the settable pulse widths, and gradually diminishes the pulse width until the temperature variance $\Delta T$ of the first switching element 10 caused by applying pulses becomes greater than or equal to the predetermined temperature Tth.

The present application is based on Japanese Priority Application No. 2014-144421, filed on Jul. 14, 2014, the entire contents of which are hereby incorporated by reference.

What is claimed is:

1. An information output apparatus comprising:
a first switching element joined through a solder part to a surface of a substrate cooled by a refrigerant, and forming one arm of a power conversion apparatus;
a second switching element connected in series with the first switching element, and forming the other arm of the power conversion apparatus;
a smoothing capacitor disposed in parallel with the first switching element and the second switching element;
a measuring unit configured to measure a temperature of the first switching element to output a measured value corresponding to the measured temperature;
an applying unit, achieved by a process performed by a processing device, configured to apply two or more continuous pulses to the first switching element and the second switching element in a state where a potential difference across the smoothing capacitor is greater than or equal to a predetermined value, the pulses causing the first switching element and the second switching element to simultaneously turn on;
an adjusting unit, achieved by a process performed by the processing device, configured to adjust pulse widths of the pulses so that a difference between a temperature of the first switching element before having the pulses applied and a temperature of the first switching element after having the pulses applied becomes greater than or equal to a predetermined temperature; and
an output unit, achieved by a process performed by the processing device, configured to output information indicating a deterioration of the solder part based on a manner of a change in measured values, the measured values being output from the measuring unit when the pulses are applied.

2. The information output apparatus as claimed in claim 1, wherein
the manner of a change in the measured values includes a peak value among the measured values or a difference between a measured value before having the pulses applied and the peak value among the measured values.

\* \* \* \* \*